(12) United States Patent
Sato

(10) Patent No.: US 10,791,627 B1
(45) Date of Patent: Sep. 29, 2020

(54) PAD AND PRINTED BOARD

(71) Applicant: Panasonic Intellectual Property Management Co., Ltd., Osaka (JP)

(72) Inventor: Daiki Sato, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/798,632

(22) Filed: Feb. 24, 2020

(51) Int. Cl.
H05K 1/11 (2006.01)
H05K 1/02 (2006.01)

(52) U.S. Cl.
CPC .......... *H05K 1/111* (2013.01); *H05K 1/0243* (2013.01); *H05K 2201/0939* (2013.01); *H05K 2201/10022* (2013.01); *H05K 2201/10484* (2013.01)

(58) Field of Classification Search
CPC .......... H05K 1/111; H05K 2201/0939
See application file for complete search history.

(56) References Cited

U.S. PATENT DOCUMENTS

| | | | | |
|---|---|---|---|---|
| 6,274,824 B1 * | 8/2001 | Rueda-Aguilocho | ........................ | H05K 1/029 174/261 |
| 6,383,603 B1 * | 5/2002 | Nojioka | .................. | H05K 1/116 174/261 |
| 7,084,353 B1 * | 8/2006 | Downes | .................. | H05K 1/111 174/255 |
| 7,916,495 B2 * | 3/2011 | Huang | .................... | H05K 1/111 361/763 |
| 2002/0109227 A1 * | 8/2002 | Liu | ........................ | H01L 24/10 257/737 |
| 2003/0052417 A1 * | 3/2003 | Hosaka | .................. | H01L 23/528 257/786 |
| 2005/0162839 A1 * | 7/2005 | Chan | ...................... | H05K 1/112 361/782 |
| 2006/0166398 A1 * | 7/2006 | Chan | ................. | H01L 23/49816 438/106 |
| 2006/0195804 A1 * | 8/2006 | Rogers | ................. | H05K 1/0295 716/102 |
| 2008/0179083 A1 * | 7/2008 | Del Rosario | .......... | H05K 1/023 174/260 |
| 2013/0049206 A1 * | 2/2013 | Ryan | ....................... | H01L 24/06 257/773 |
| 2016/0073500 A1 * | 3/2016 | Wu | ......................... | H05K 1/113 361/782 |
| 2016/0199727 A1 * | 7/2016 | Brazier | ..................... | A63F 9/10 463/9 |

(Continued)

FOREIGN PATENT DOCUMENTS

| | | |
|---|---|---|
| JP | 03-200223 | 9/1991 |
| JP | 11-272716 | 10/1999 |
| JP | 2006-261492 | 9/2006 |

(Continued)

*Primary Examiner* — Hoa C Nguyen
(74) *Attorney, Agent, or Firm* — Wenderoth, Lind & Ponack, L.L.P.

(57) ABSTRACT

A pad 11 is disposed at an end point of a first wiring 17 provided on a board 15, is connectable to one of N (N: an integer of two or more) wirings provided on the board 15 via a resistor or a conductor, and has (N+1) sides that are disposed by deforming respective sides of an equilateral polygon having (N+1) sides into convex sides each having a radius of curvature that is larger than a radius of curvature of a circumscribed circle of the equilateral polygon.

4 Claims, 7 Drawing Sheets

(56) References Cited

U.S. PATENT DOCUMENTS

2016/0233180 A1 8/2016 Walker
2019/0088605 A1 3/2019 Walker

FOREIGN PATENT DOCUMENTS

| JP | 2007-173388 | 7/2007 |
| JP | 2018-500752 | 1/2018 |

* cited by examiner

PAD AND PRINTED BOARD

BACKGROUND OF THE INVENTION

1. Field of the Invention

The present disclosure relates to a pad and a printed board.

2. Background of the Art

JP-A-2018-500752 discloses a spoked solder pad that improves the solderability and self-alignment of an integrated circuit package. This pad layout is a pad layout of a solder pad for joining an integrated circuit package and a circuit board, and includes a center pad portion and at least three radial protrusions which radially disposed about the center pad portion and coupled to the center pad portion. The pad layout has a size fit within the area defined by the outer shape of the integrated circuit package. The integrated circuit package and the circuit board are soldered and joined to each other by the center pad portion and the at least three radial protrusions.

SUMMARY OF INVENTION

The present disclosure has been invented in view of the above-described circumstances of the related art, and aims to provide a pad and a printed board that improve the quality of a signal transmitted as compared with the related art, particularly, when using a signal in a high-frequency band suitable for high-speed data transmission.

The present disclosure provides a pad which is disposed at an end point of a first wiring provided on a board, which can be connected to one of N wirings provided on the board via a resistor or a conductor, where N is two or more, and individual sides of which are formed by deforming respective sides of an equilateral polygon having (N+1) sides into convex sides each having a radius of curvature that is larger than a radius of curvature of a circumscribed circle of the equilateral polygon.

The present disclosure provides a printed board that includes a board; a first wiring provided on the board; N wirings which are provided on the board, each of which is connectable to the first wiring via a resistor or a conductor, where N is two or more; and pads that are disposed at an end point of the first wiring and each of start points of the N wirings wherein each of the pads has (N+1) sides that are formed by deforming respective sides of an equilateral polygon having (N+1) sides into convex sides each having a radius of curvature that is larger than a radius of curvature of a circumscribed circle of the equilateral polygon.

According to the present disclosure, in a pad, the quality of a transmitted signal can be improved as compared with the related art, particularly, when using a signal in a high-frequency band suitable for high-speed data transmission.

According to the present disclosure, in a printed board, an unnecessary wiring or a right-angle wiring can be eliminated, and the quality of a transmitted signal can be improved as compared with the related art, particularly, when using a signal in a high-frequency band suitable for high-speed data transmission.

DETAILED DESCRIPTION OF THE EXEMPLARY EMBODIMENT

Hereinafter, an embodiment which specifically discloses a pad and a printed board according to the present disclosure will be described in detail with reference to the drawings as appropriate. However, more detailed description than necessary may be omitted. For example, detailed explanation of already well-known matters and duplicate explanation for substantially the same configuration may be omitted. This is to avoid the following explanation becoming unnecessarily redundant and facilitate understanding by those skilled in the art. The attached drawings and the following description are provided to enable those skilled in the art to fully understand the present disclosure but not intended to limit the claimed subject matter.

Background to the Present Disclosure

The pad layout of the related art can effectively utilize the surface tension of solder. However, in the case of a pad on which a resistor or a conductor is obliquely mounted, the width of the pad in a direction intersecting the direction in which current flows differs. For example, in the case of a rectangular pad, the width of the pad gradually changes in the direction in which current flows. Thus, the impedance of the pad changes and the pad is easily affected by noise. The deterioration of signal quality due to the noise is a remarkable loss particularly when using a signal in a high-frequency band (for example, a signal in a frequency band of 1 GHz or more) suitable for high-speed data transmission.

First Embodiment

Hereinafter, a pad and a printed board which can improve signal quality compared to the related art, particularly in high-speed signal transmission, will be described.

Figure 1:
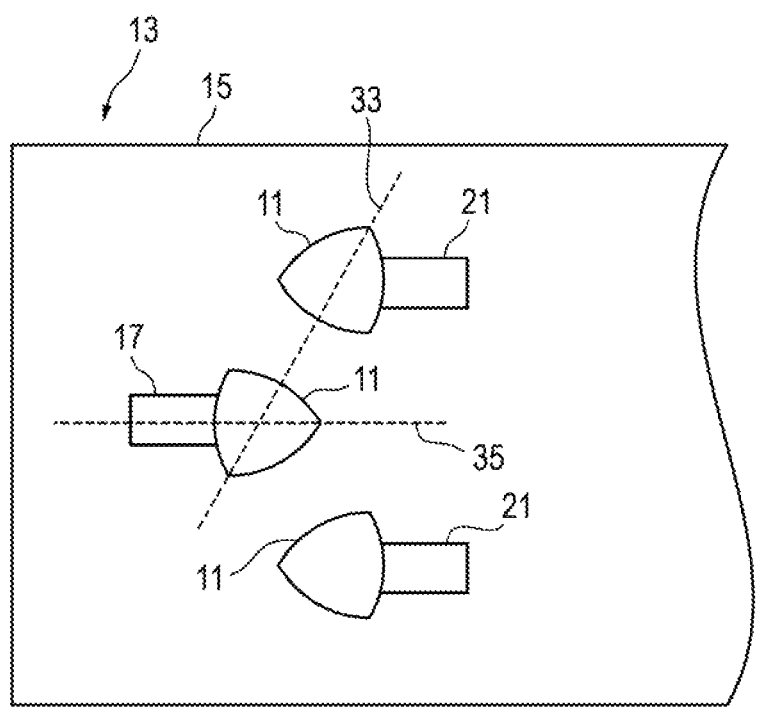
FIG. 1 is a plan view of a main part of a printed board provided with pads according to a first embodiment.

FIG. 1 is a plan view of a main part of a printed board 13 provided with pads 11 according to a first embodiment. The pads 11 of the first embodiment are provided on the printed board 13. The printed board 13 is formed, for example, by printing a conductor figure (so-called wiring pattern) for wiring by a photolithography process or the like. In the photolithography process, a photosensitive film is applied on a board to form a resist film formed board, and a resist pattern is formed by exposing (drawing a wiring pattern) and developing the resist film formed board. In the exposure, a design pattern is transferred onto the resist film formed board by exposing the resist film formed board while keeping a mask in close contact with the resist film formed board. The wiring pattern is left by corroding the resist film formed board with an acidic aqueous solution. In the printed board 13, instead of the above-described printing method, the design pattern may be formed by laser processing a metal foil attached to the surface of the board or laser processing a plated layer deposited on the board surface.

As a board 15, for example, a paper phenol board, a paper epoxy board, a glass composite board, a glass epoxy board, a glass polyimide board, a fluorine board, a glass PPO board, a ceramic board, or the like can be used. In addition, the board 15 may be a flexible board such as an FPC (flexible printed circuit board) having a mounting surface.

The printed board 13 of the first embodiment includes a first wiring 17 provided on the board 15 and two wirings provided on the board 15. One of the wirings is connected to the first wiring 17 using a resistor 19 or a conductor (hereinafter, referred to as "resistor 19 or the like"). In FIG. 1, the number of the wirings is two for easy understanding but may be N (N: an integer of two or more).

Figure 2:
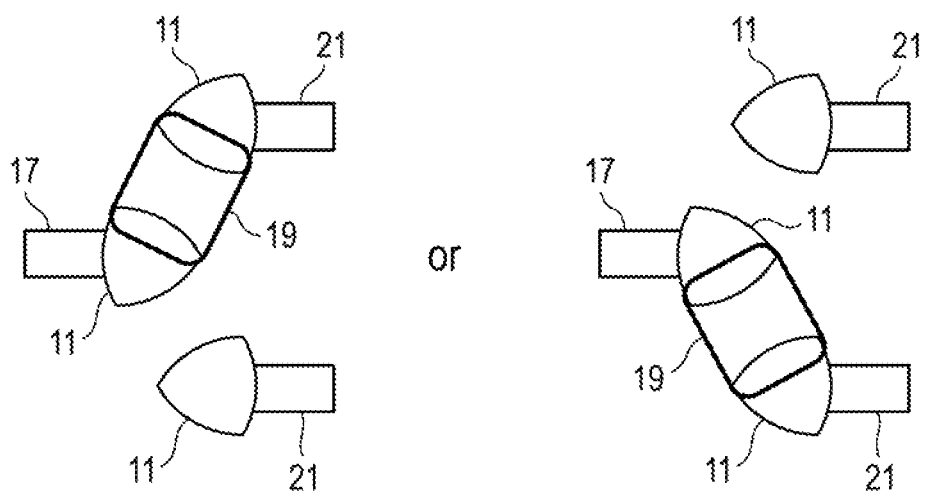
FIG. 2 is schematic diagrams showing an example of switching between a first wiring and two branch wirings shown in FIG. 1.

FIG. 2 is schematic diagrams showing an example of switching between the first wiring 17 and two branch wirings 21 shown in FIG. 1. The printed board 13 is provided with plural types of branch circuits on the same board 15 so as to share the printed board. In the printed board 13 of the first embodiment, the resistor 19 is obliquely mounted on the pad 11 formed at the end point of the first wiring 17, thereby connecting the resistor to one of N wirings (for example, two branch wirings 21). In the printed board 13, since the pad 11 formed at the end point of the first wiring 17 can be shared, a stub circuit 23 (see FIG. 4) can be omitted. Further, since the resistor 19 or the like is mounted obliquely, a right-angle wiring 25 (see FIG. 4) can also be omitted.

In the shared printed board 13, switching between mounting and non-mounting of the resistor 19 or the like on one of the plurality of branch circuits is performed according to the specification. This makes it possible to mass-produce, by using one type of the printed board 13 thus shared, a low-cost general-purpose circuit body that can support a plurality of specifications.

On the printed board 13, the pads 11 are formed at the end point of the first wiring 17 and at the start point of each of the N wirings. In the printed board 13, by changing the shape of the pad 11 at the location of the branch wiring and thus sharing the pad, an unnecessary wiring or a right-angle wiring can be eliminated and signal quality can be improved.

This pad 11 is formed by coupling (N+1) sides that are formed by deforming respective sides of an equilateral polygon having (N+1) sides into convexes each having a radius of curvature that is larger than a radius of curvature of a circumscribed circle 27 (see FIG. 3) of the equilateral polygon. In the first embodiment, since the N wirings are two branch wirings 21 (N=2), the pad 11 becomes an equilateral triangle 29 having 2+1=3 sides (see FIG. 3). Each side of the equilateral triangle 29 is deformed into the convex having the radius of curvature larger than the radius of curvature of the circumscribed circle 27 of the equilateral polygon. The pad 11 can suppress a change in impedance on the pad by making each side of the equilateral triangle 29 facing the corresponding vertex thereof into a sector shape.

Figure 3:
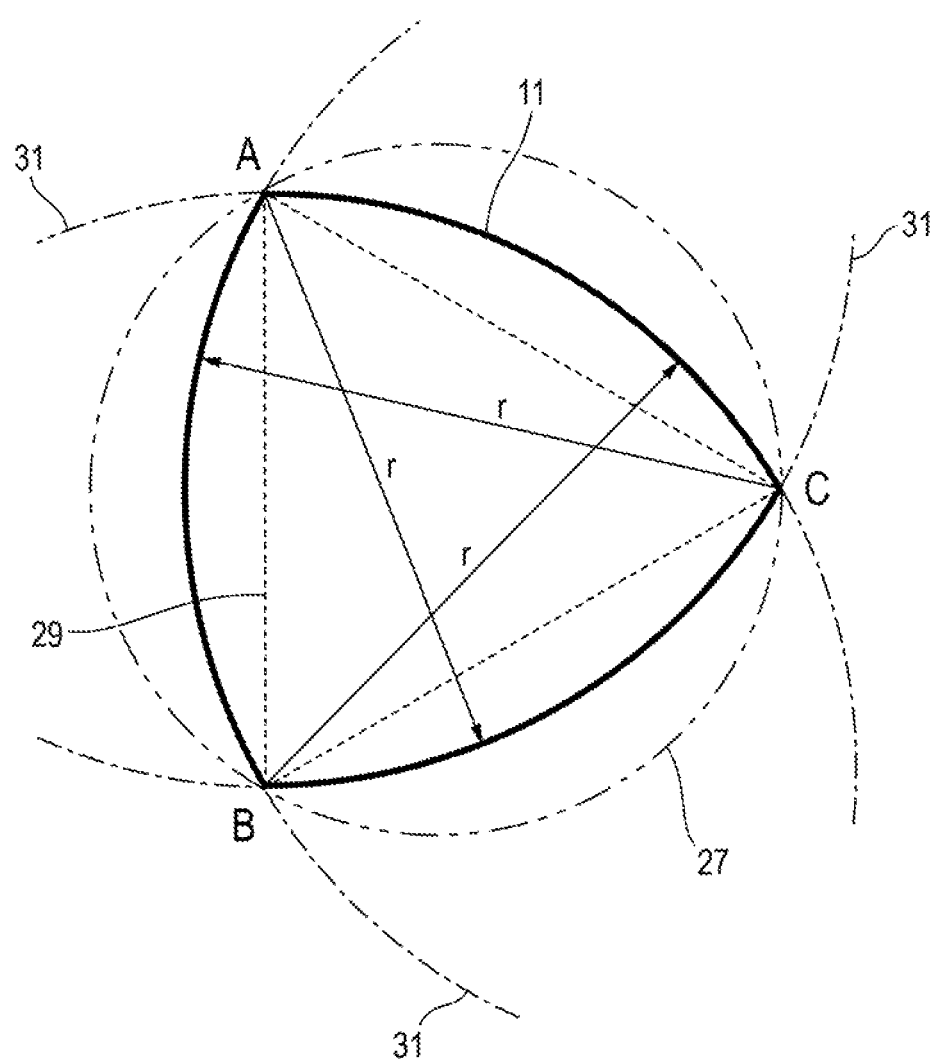
FIG. 3 is an explanatory diagram showing an example of a Reuleaux polygon.

FIG. 3 is an explanatory diagram showing an example of a Reuleaux polygon. In the pad 11, each of the (N+1) (=3) sides forming the pad 11 is formed, for example, according to a Reuleaux triangle (example of Reuleaux polygon). A Reuleaux polygon can be formed by expanding each side of an equilateral odd-number polygon. As shown in FIG. 3, for example, in a Reuleaux triangle, each of the sides facing the vertices A, B, and C is formed by expanding corresponding one side of the equilateral triangle 29 so as to be an arc of a curvature circle 31 having a radius r which is the length of one side of the equilateral triangle. In other words, each side of the equilateral triangle 29 forms an arc of the curvature circle 31. The arc of the curvature circle 31 expanded from the side is located between the side of the equilateral triangle 29 and the circumscribed circle 27 of the equilateral triangle 29. In other words, the arc expands outside the side of the equilateral triangle 29 and does not expand as much as the circumscribed circle 27 of the equilateral triangle 29.

In the pad 11 formed at the end point of the first wiring 17, one side before expansion is formed in a direction orthogonal to the center line of the first wiring 17. That is, one vertex of the pad exists on the extended center line of the first wiring 17. The pad 11 formed at the start point of the branch wiring 21 is arranged opposite to the pad formed at the end point such that one side before expansion of the pad formed at the start point is parallel to one side before expansion of the pad 11 formed at the end point. In the two pads 11 arranged opposite to each other, a virtual line 33 (FIG. 1) passing through the midpoints of these parallel sides passes through a vertex of each equilateral triangle 29 of these pads. An angle between the virtual line 33 and an extended center line 35 (FIG. 1) of the first wiring 17 is 60°. That is, the resistor 19 or the like is mounted obliquely at an inclination angle of 60° with respect to the extended center line 35 of the first wiring 17.

In the pad 11, each of the N wirings to be connected is a so-called equal-length wiring. In the first embodiment, each of the two branch wirings 21 is the equal-length wiring. By making the lengths of the individual wiring patterns equal using the equal-length wirings, the delay of the wiring patterns generated on the board can be made equal.

In the first embodiment, the example in which the equilateral polygon is an equilateral triangle 29 has been described, but the pad 11 can be an arbitrary equilateral polygon corresponding to the N wirings. Also in this case, similarly to the above-described configuration, each side of the equilateral polygon is deformed into a convex having a radius of curvature larger than the radius of curvature of the circumscribed circle 27 in the equilateral polygon. In this case, the equilateral polygon is more preferably a Reuleaux polygon.

Next, the operation of the configuration of the pad 11 or the printed board 13 according to the first embodiment will be described.

The pad 11 of the first embodiment is formed at the end point of the first wiring 17 provided on the board 15 and can be connected to one of the N (N: an integer of two or more) wirings provided on the board 15 using the resistor 19 or a conductor. The pad 11 is an equilateral polygon configured to have (N+1) sides that are formed by deforming respective sides of the equilateral polygon having (N+1) sides into the convexes each having the radius of curvature that is larger than the radius of curvature of the circumscribed circle 27 of the equilateral polygon.

In the pad 11 of the first embodiment, at least the end point of the first wiring 17 provided on the board 15 serves as a pad forming portion. The pad 11 formed at the end point of the first wiring 17 is connected to one of N wirings provided on the same board 15 using the resistor 19 or the like, where N is two or more. The other end of the resistor 19 or the like, one end of which is connected to the pad 11, is connected to a start point of one of the N wirings. Another pad 11 is preferably formed also at this start point. In this case, the resistor 19 or the like is mounted from the pad 11 formed at the end point of the first wiring 17 to one of the pads 11 that are respectively formed at the start points of the N wirings, whereby the first wiring 17 is electrically connected to one of the N wirings.

In the printed boards, there is a case where plural types of boards having a shared main circuit and different branch circuits must be produced in small quantities. In such a case, plural types of branch circuits are sometimes provided on the same board 15 together with the main circuit in order to reduce the manufacturing cost and share the printed board. In this shared printed board, switching between mounting and non-mounting of the resistor 19 or the like is performed on one of the plurality of branch circuits according to the specification. This makes it possible to mass-produce, at low cost, a general-purpose circuit body that can support a plurality of specifications, by using the one type of shared printed board.

Figure 4:
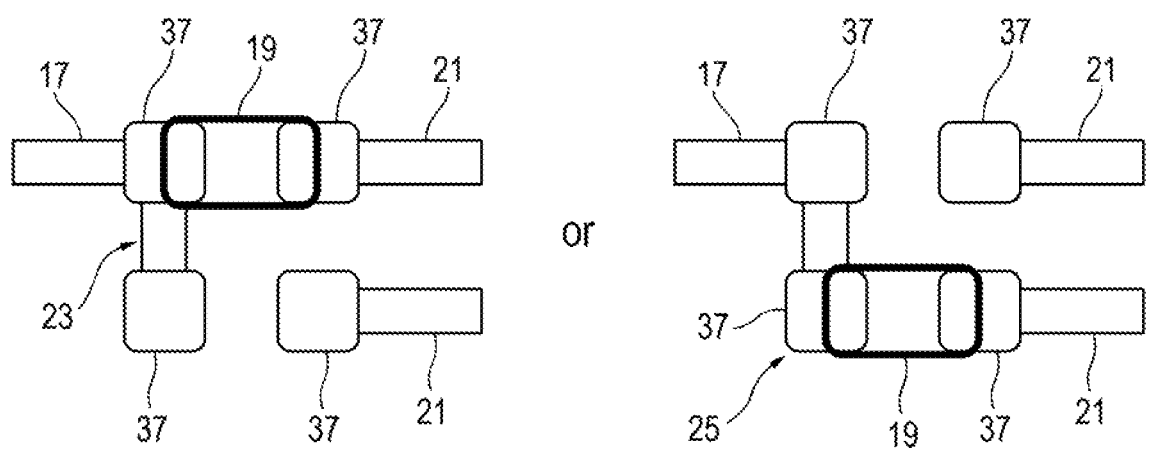
FIG. 4 is schematic diagrams of a comparative example in which a stub circuit switches between a first wiring and two branch wirings.

FIG. 4 is schematic diagrams of a comparative example in which a stub circuit 23 switches between a first wiring 17 and two branch wirings 21. In a printed board in which sharing is achieved, a rectangular pad 37 is formed at an end point of the first wiring 17 and the stub circuit 23 is formed on the pad 37, as shown, for example, in the comparative example of FIG. 4. Another same pad 37 is formed at an end point of the stub circuit 23. Pads 37 provided at the two branch wirings 21 constituting branch circuits are arranged to face the pad 37 of the first wiring 17 and the pad 37 of the stub circuit 23. In this printed board, a plurality of specifications can be supported by performing the switching between mounting and non-mounting of the resistor 19 or the like on the pad 37 of the first wiring 17 and pad 37 of the branch wiring 21 opposed thereto, or on the pad 37 of the stub circuit 23 and the pad 37 of the branch wiring 21 opposed thereto.

In this case, if an unnecessary stub circuit 23 corresponding to the branch wiring 21 on which the resistor or the like is not mounted remains, there is a problem that signal quality deteriorates. When a right-angle wiring 25 was formed using the stub circuit 23, it was also observed that high-speed signals were reflected and signal quality was degraded. This is because the width of the wiring pattern of the right-angle wiring 25 is wider than that of a straight line portion, so that the impedance is changed in the right-angle wiring and the wiring is easily affected by noise.

Figure 5:
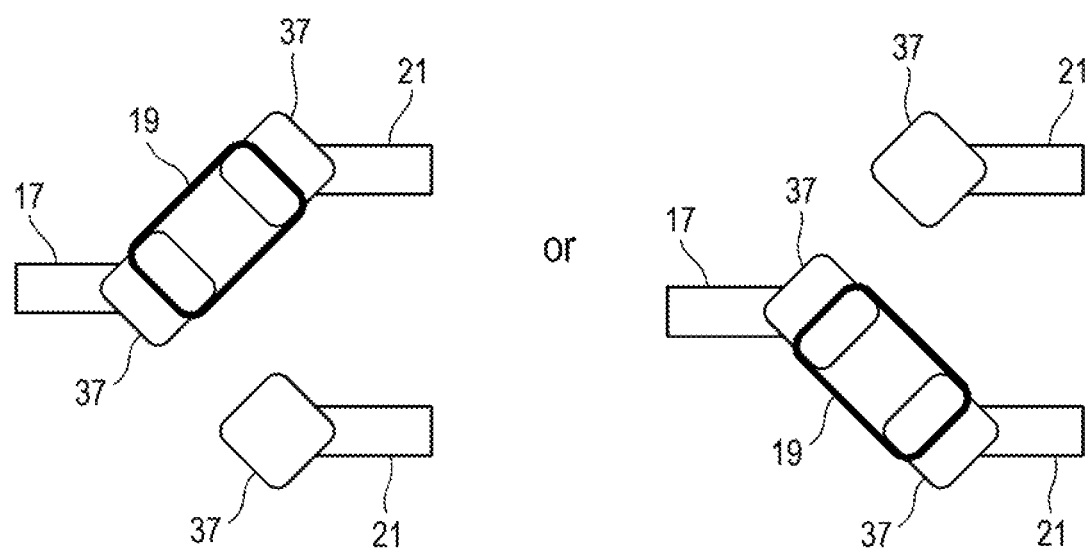
FIG. 5 is schematic diagrams of a reference example in which connection between a first wiring and two branch wirings is switched by oblique mounting.

FIG. 5 is schematic diagrams of a reference example in which connection between a first wiring and two branch wirings 21 is switched by oblique mounting. As shown in the reference example of FIG. 5, if a method is adopted in which a resistor 19 or the like is obliquely mounted on a pad 37 formed at the end point of the first wiring 17 and connected to one of the two branch wirings 21, since the pad 37 formed at the end point of the first wiring 17 can be shared, a stub circuit 23 can be omitted. The oblique mounting of the resistor 19 or the like also can eliminate a right-angle wiring 25.

Figure 6:
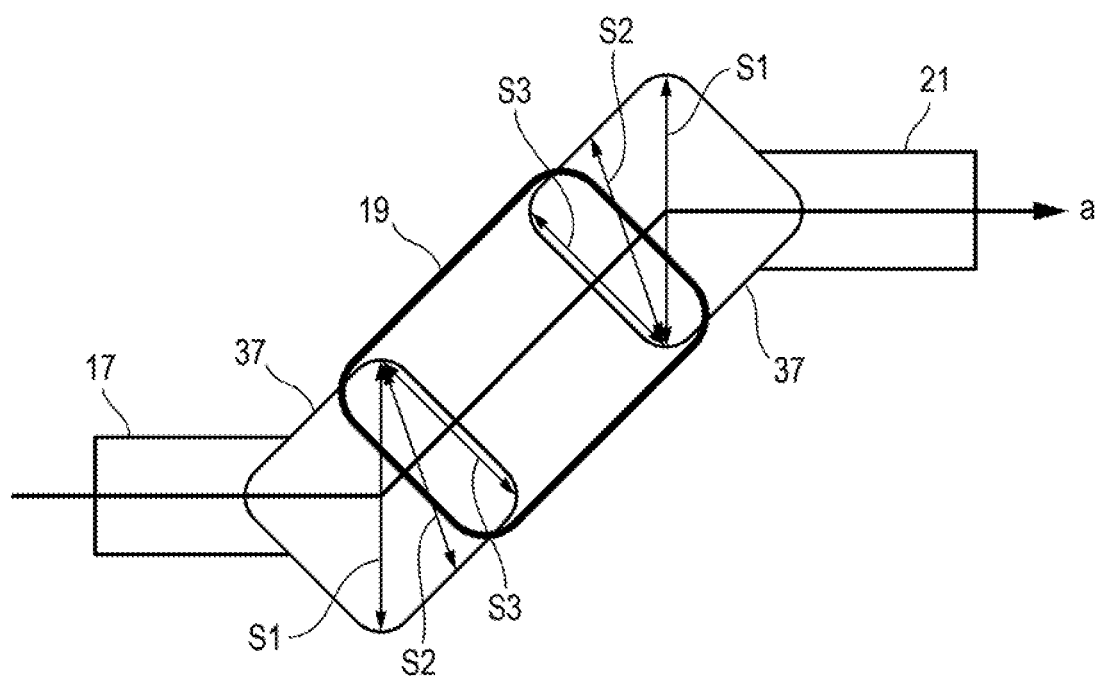
FIG. 6 is an enlarged diagram of a main part of FIG. 5.

FIG. 6 is an enlarged diagram of a main part of FIG. 5. In the case of the pad 37 of a rectangular shape, if the oblique mounting is performed, the width of the pad 37 in a direction intersecting a direction a in which the current flows in the pad 37 varies. That is, as shown in FIG. 6, in the rectangular pad 37 formed at the end point of the first wiring 17, the width of the pad 37 gradually decreases in the current flowing direction a in the order of s1, s2, and s3 (s1>s2>s3). In the rectangular pad 37 formed at the start point of the branch wiring 21, the width of the pad 37 gradually increases in the current flowing direction a in the order of s3, s2, and s1 (s3<s2<s1). For this reason, as in the above, the impedance changes and reflection is likely to occur at the pad 37, and thus the pad is easily affected by noise. The deterioration of signal quality due to the noise causes a remarkable loss particularly when a signal in a high-frequency band (for example, a signal in a frequency band of 1 GHz or more) suitable for high-speed data transmission is used.

When the pad is circular, the area where the pad overlaps the resistor 19 or the like becomes large. The area of the circular pad that protrudes from the resistor 19 or the like is smaller than that of a pad having, for example, a rectangular shape, and almost all of the pad overlaps with a mounted component such as the resistor 19 or the like under the mounted component. Thus, there is a problem that solder is pushed out by the resistor 19 or the like, and solder balls are easily generated. In addition to this, the entire circumference of the circular pad projects outward as an arc, so that the distance between adjacent pads is likely to be short. For this reason, the circular pad has a short creepage distance on the board and thus it is difficult to ensure safety.

When the pad is triangular, the amount of solder is insufficient. The pad having the shape of the equilateral triangle 29 thus needs to be increased in size in order to increase the amount of solder. In this case, since the size difference from the wiring width becomes large, the impedance changes in the pad, and thus the pad becomes susceptible to noise.

In view of the above, the pad of the first embodiment is formed by coupling (N+1) sides that are formed by deforming respective sides of an equilateral polygon into convexes each having a radius of curvature that is larger than a radius of curvature of the circumscribed circle 27 of the equilateral polygon. When one of N wirings is connected using the resistor 19 or the like, the number of sides of the equilateral polygon is (N+1), where N is two or more.

For example, when one of the two wirings (branch wirings 21) is made connectable to the first wiring 17, the pad 11 is formed by deforming each side of the equilateral polygon 29 into a convex having a radius of curvature that is larger than the radius of curvature of the circumscribed circle 27 of the equilateral polygon. Thus, this pad has an area larger than that of the equilateral triangle 29 by the extent that each side is round, and the amount of solder can be increased. As a result, even if the pad 11 is small, the resistor 19 or the like can be easily mounted.

Since each side of the pad 11 expands outward, a change between the width of the pad 11 and the width of the wiring (foil) in the current flowing direction a can be suppressed smaller than where there is a straight side of the equilateral triangle 29 or the like. Thus, the pad 11 has a smaller difference in resistance value on the pad. On the pad having a small difference in resistance value, signal reflection hardly occurs, and loss is suppressed. As a result, in the pad 11, a change in impedance can be suppressed, and the pad can be hardly affected by noise. The effect of improving the signal quality with respect to the noise is particularly remarkable when the signal speed is increased (for example, 1 GHz or more).

The pad 11 has a larger radius of curvature (that is, a smaller curvature) expanding outward than the circular pad, and therefore does not spread outward, so that the creepage distance between the pads on the board can be easily secured. As a result, it is also advantageous in terms of safety.

In the pad 11, the equilateral polygon is a Reuleaux polygon.

In this pad 11, the outer shape of the pad 11 is a Reuleaux polygon. The Reuleaux polygon can be formed by expanding each side of an equilateral odd polygon. For example, in a Reuleaux triangle, each of the sides facing the vertices A, B, and C is formed by expanding corresponding one side of the equilateral triangle 29 so as to be the arc of the curvature circle 31 having the radius r which is the length of one side of the equilateral triangle. In other words, each side of the equilateral triangle 29 becomes an arc of the curvature circle 31. The arc of the curvature circle 31 expanded from the side is located between the side of the equilateral triangle 29 and the circumscribed circle 27 of the equilateral triangle 29. In other words, the arc expands outside the side of the equilateral triangle 29 and does not expand as much as the circumscribed circle 27 of the equilateral triangle 29.

In this pad 11, the area is increased and the amount of solder can be increased by the extent that each side expands to form the arc of the curvature circle 31 with respect to the equilateral triangle 29. As a result, even if the pad 11 is smaller than the pad having the shape of the equilateral triangle 29, the resistor 19 or the like can be easily mounted.

This pad has a larger radius of curvature (that is, a smaller curvature) expanding outward than the circular pad circumscribing the equilateral triangle 29, and therefore does not spread outward, so that the creepage distance between the pads on the board can be easily secured. As a result, it is also advantageous in terms of safety.

The pad 11 formed by the Reuleaux polygon has a rotationally symmetric shape. For this reason, when designing a circuit using CAD, if the pad 11 is used at the end point of the first wiring 17 or the start point of the branch wiring 21 which must be shared, the pad can be easily duplicated in multiple positions by changing only the rotation angle. As a result, this pad can significantly reduce the number of design steps as compared with a pad having no rotationally symmetric shape, such as a D-shaped pad.

Figure 7:
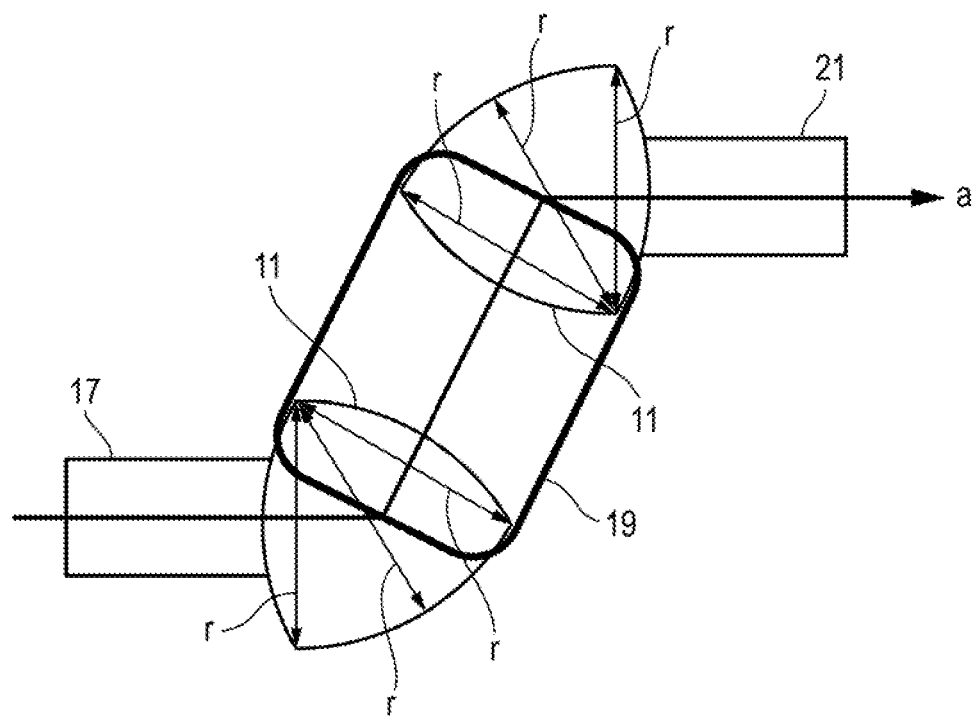
FIG. 7 is an enlarged diagram of a main part of FIG. 2.

FIG. 7 is an enlarged diagram of a main part of FIG. 2. When obliquely mounting the resistor 19 or the like on the pad 11 formed at the end point of the first wiring 17 and connecting the resistor or the like to the branch wiring 21, the width of the pad 11 in the direction intersecting the current flowing direction a in the pad 11 becomes constant. That is, as shown in FIG. 7, in the pad 11 formed by the Reuleaux polygon, the width of the pad 11 in the current flowing direction a is the radius r of the curvature circle 31 and is constant.

In the wiring of the printed board 13 that can be shared, the pad 11 of the first wiring 17 is shared when branching is performed depending on the mounting or non-mounting of the resistor 19 or the like. By matching the shape of the pad at that time to the Reuleaux polygon, the difference between the width of the pad 11 and the width of the wiring (foil) becomes constant, and thus the difference of the resistance value decreases. In the pad 11, the difference in resistance values on the pad become also small. On the pad having a small difference in resistance value, signal reflection hardly occurs, and loss is suppressed. As a result, in the pad 11, a change in impedance is less likely to occur, and the pad can be hardly affected by noise. The effect of improving the signal quality with respect to the noise is particularly remarkable when the signal speed is increased (for example, 1 GHz or more).

In the pad 11, each of the N wirings is an equal-length wiring.

In the pad 11, each of the N wirings connected to the first wiring 17 by the resistor 19 or the like is an equal-length wiring. The equal-length wirings can suppress, for example, variations in signal timing with respect to a clock signal. Since the N wirings are formed such that the lengths of the individual wiring patterns are equal, delays of the wirings generated on the board are equal. Since the N wirings connected to the pad 11 are the equal-length wirings, the delay on both the pad and the wiring pattern becomes equal, so that the delay amount can be adjusted with higher accuracy.

The printed board 13 of the first embodiment includes the board 15; the first wiring provided on the board; N wirings which are provided on the board, each of which is connectable to the first wiring using a resistor or a conductor, where N is an integer of two or more; and the pads which are formed at the end point of the first wiring and the start points of the N wirings, respectively, wherein each of the pads includes (N+1) sides that are formed by deforming respective sides of an equilateral polygon having (N+1) sides into convexes each having a radius of curvature that is larger than the radius of curvature of the circumscribed circle of the equilateral polygon.

In the printed board 13 of the first embodiment, the resistor 19 or the like is obliquely mounted on the pad 11 formed at the end point of the first wiring 17, thereby connecting the resistor or the like to one of the N wirings. In the printed board 13, since the pad 11 provided at the end point of the first wiring 17 can be shared, the stub circuit 23 can be omitted. Further, since the resistor 19 or the like is mounted obliquely, the right-angle wiring 25 can also be omitted.

The pad 11 is formed by deforming each side of the equilateral polygon into the convex having the radius of curvature that is larger than the radius of curvature of the circumscribed circle 27 of the equilateral polygon. Thus, similar to the action described above, the area of the pad increases by the extent that each side is round, and the amount of solder can be increased. As a result, even if the pad 11 is small, the resistor 19 or the like can be easily mounted.

Since each side of the pad 11 expands outward, a change between the width of the pad 11 and the width of the wiring (foil) in the current flowing direction a can be suppressed smaller than where there is a straight side of the equilateral triangle 29 or the like. Thus, the pad 11 has a smaller difference in resistance value on the pad. On the pad having a small difference in resistance value, signal reflection hardly occurs, and loss is suppressed. As a result, in the printed board 13, a change in impedance can be suppressed, and the board can be hardly affected by noise. The effect of improving the signal quality with respect to the noise is particularly remarkable when the signal speed is increased (for example, 1 GHz or more).

The pad 11 has a larger radius of curvature (that is, a smaller curvature) expanding outward than the circular pad, and therefore does not spread outward, so that the creepage distance between the pads on the board can be easily secured. As a result, the printed board 13 provided with the pads 11 is also advantageous in terms of safety.

Thus, according to the pad 11 of the first embodiment, the signal quality can be improved compared to the related art, particularly in high-speed signal transmission.

According to the printed board 13 of the first embodiment, an unnecessary wiring or the right-angle wiring 25 can be eliminated, and the signal quality can be improved compared to the related art, particularly in high-speed signal transmission.

Experimental Example

Next, the results of actual measurement of the impedance value of each of pads which were manufactured to have the same configurations as the pad shown in FIG. 6 and the pad shown in FIG. 7 will be described.

[Common Conditions]
Impedance value of wiring pattern: 49.65 ohm
Line width: 0.11 mm
Interlayer distance: 0.065 mm
Pad thickness: 0.035 mm
Board permittivity: 4.3
Frequency: 10 GHz

[Pad Shown in FIG. 6]
In the case of line width S1: 0.404 mm
Impedance value: 21.38 ohm
Difference from wiring pattern: 28.27 ohm

[Pad Shown in FIG. 7]
In the case of line width r: 0.33 mm
Impedance value: 24.87 ohm
Difference from wiring pattern: 24.78 ohm It was observed by the measurement performed under the above conditions that the pad shown in FIG. 6 and the pad shown in FIG. 7 had a difference in impedance value of 28.27−24.78 ohm=3.49 ohm.

Although various embodiments have been described with reference to the drawings, it is needless to say that the present disclosure is not limited to such embodiments. It is obvious that those skilled in the art can conceive various changes, modifications, substitutions, additions, deletions, and equivalents within the scope of the claims, and it is understood that such various changes and the like naturally belong to the technical scope of the present disclosure. Each constituent element in the above-described various embodiments may be arbitrarily combined without departing from the spirit of the invention.

The present disclosure is useful as a pad and a printed board that improve the quality of a signal transmitted as compared with the related art, particularly, when using a signal in a high-frequency band suitable for high-speed data transmission.

What is claimed is:

1. A pad
    configured to be disposed at an end point of a first wiring provided on a board;
    configured to be connectable to one of N wirings provided on the board via a resistor or a conductor, where N is an integer of two or more; and
    configured to include (N+1) sides that are formed by deforming respective sides of an equilateral polygon having (N+1) sides into convex sides each having a radius of curvature that is larger than a radius of curvature of a circumscribed circle of the equilateral polygon.

2. The pad according to claim 1, wherein:
    the equilateral polygon is a Reuleaux polygon.

3. The pad according to claim 1, wherein:
    each of the N wirings is an equal-length wiring.

4. A printed board comprising:
    a board;
    a first wiring configured to be provided on the board;
    N wirings configured to be provided on the board, each of the N wirings being configured to be connectable to the first wiring via a resistor or a conductor, where N is an integer of two or more; and
    pads configured to be disposed at an end point of the first wiring and each of start points of the N wirings, the pads being configured to include (N+1) sides which are formed by deforming respective sides of an equilateral polygon having (N+1) sides into convex sides each having a radius of curvature that is larger than a radius of curvature of a circumscribed circle of the equilateral polygon.

* * * * *